(12) United States Patent
Oh et al.

(10) Patent No.: US 12,156,426 B2
(45) Date of Patent: Nov. 26, 2024

(54) DISPLAY DEVICE INCLUDING FLEXIBLE GROOVED SUBSTRATE

(71) Applicant: Samsung Display Co., LTD., Yongin-si (KR)

(72) Inventors: Ae Ly Oh, Hwaseong-si (KR); Byoung Dae Ye, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 312 days.

(21) Appl. No.: 17/227,920

(22) Filed: Apr. 12, 2021

(65) Prior Publication Data

US 2022/0077432 A1    Mar. 10, 2022

(30) Foreign Application Priority Data

Sep. 4, 2020   (KR) .................. 10-2020-0113235

(51) Int. Cl.
*H10K 50/84*    (2023.01)
*H10K 50/80*    (2023.01)
*H10K 50/86*    (2023.01)
*G02F 1/1335*   (2006.01)
(Continued)

(52) U.S. Cl.
CPC .......... *H10K 50/868* (2023.02); *H10K 50/84* (2023.02); *G02F 1/133528* (2013.01); *G06F 1/1641* (2013.01); *G06F 1/1652* (2013.01); *G09G 2300/0408* (2013.01); *G09G 2300/0804* (2013.01); *H10K 2102/00* (2023.02); *H10K 2102/311* (2023.02)

(58) Field of Classification Search
CPC ............. H01L 51/5293; H01L 51/5237; H01L 51/0097; H01L 51/5281; H01L 51/52; H01L 51/5253; H01L 2251/5338; H01L 2251/558; H01L 2251/301; H01L 27/3241; G06F 1/1652; G06F 1/1641; G09F 9/301; H10K 50/868; H10K 50/84; H10K 50/86; H10K 50/80; H10K 50/844; H10K 59/87; H10K 59/10; H10K 77/111; H10K 2102/00; H10K 2102/311; H10K 2102/351; G02F 1/133528; G09G 2300/0408; G09G 2300/0804
See application file for complete search history.

(56) References Cited

U.S. PATENT DOCUMENTS 10,642,313 B1 *  5/2020  Wu ................. H01L 27/322
10,672,304 B2 *  6/2020  Choi ................. G09F 9/301
11,007,749 B2 *  5/2021  Lim ................. B32B 3/02
(Continued)

FOREIGN PATENT DOCUMENTS

CN       110570764 A  * 12/2019  ............. G09F 9/301
KR    10-2018-0120311     11/2018
(Continued)

*Primary Examiner* — Ida M Soward
(74) *Attorney, Agent, or Firm* — KILE PARK REED & HOUTTEMAN PLLC

(57) ABSTRACT

A display device includes a substrate including a first area, a second area, and a bending area disposed between the first area and the second area; a display area overlapping the first area; and a passivation layer overlapping the bending area, wherein the substrate includes a groove formed in the bending area, and an angle between a side wall of the groove of the substrate and an upper surface of the substrate is about 90 degrees or less.

21 Claims, 9 Drawing Sheets

(51) Int. Cl.
*G06F 1/16* (2006.01)
*H10K 102/00* (2023.01)

(56) References Cited

U.S. PATENT DOCUMENTS

| | | | | |
|---|---|---|---|---|
| 11,362,292 | B2* | 6/2022 | Lee | H01L 27/124 |
| 2013/0216740 | A1* | 8/2013 | Russell-Clarke | G06F 1/1616 |
| | | | | 219/121.72 |
| 2014/0192491 | A1* | 7/2014 | Chiang | H05K 3/28 |
| | | | | 361/749 |
| 2015/0049428 | A1* | 2/2015 | Lee | G06F 1/1652 |
| | | | | 361/679.27 |
| 2015/0131222 | A1* | 5/2015 | Kauhaniemi | G06F 1/1681 |
| | | | | 16/225 |
| 2016/0218305 | A1* | 7/2016 | Kim | H10K 59/124 |
| 2016/0295685 | A1* | 10/2016 | Ryu | G06F 1/1652 |
| 2016/0329520 | A1* | 11/2016 | Namkung | H10K 50/844 |
| 2017/0110526 | A1* | 4/2017 | Eo | H10K 50/844 |
| 2017/0207412 | A1* | 7/2017 | Jeong | H01L 27/3244 |
| 2017/0263887 | A1* | 9/2017 | Han | H10K 77/111 |
| 2018/0034002 | A1* | 2/2018 | Kim | H01L 51/5253 |
| 2018/0047938 | A1* | 2/2018 | Kishimoto | H10K 59/873 |
| 2018/0090698 | A1* | 3/2018 | Jeong | H10K 59/131 |
| 2018/0097199 | A1* | 4/2018 | Jo | H01L 51/5253 |
| 2018/0150108 | A1* | 5/2018 | Song | G06F 1/1677 |
| 2018/0166019 | A1* | 6/2018 | Lee | G02F 1/136227 |
| 2018/0175310 | A1* | 6/2018 | Lee | B32B 27/08 |
| 2018/0190936 | A1* | 7/2018 | Lee | B32B 25/20 |
| 2018/0350701 | A1* | 12/2018 | Kim | G02F 1/1345 |
| 2019/0036068 | A1* | 1/2019 | Kim | G06F 1/1652 |
| 2019/0067410 | A1* | 2/2019 | Kwon | H10K 77/111 |
| 2019/0207141 | A1* | 7/2019 | Kim | H10K 77/111 |
| 2020/0006397 | A1* | 1/2020 | Park | H01L 27/1244 |
| 2020/0152096 | A1* | 5/2020 | Jia | H01L 51/5253 |
| 2020/0203459 | A1* | 6/2020 | Wang | H10K 77/111 |
| 2020/0341516 | A1* | 10/2020 | Huang | G06F 1/181 |
| 2021/0013237 | A1* | 1/2021 | Ke | H01L 51/5253 |
| 2021/0168929 | A1* | 6/2021 | Wang | H05K 1/028 |

FOREIGN PATENT DOCUMENTS

| | | |
|---|---|---|
| KR | 10-2019-0023644 | 3/2019 |
| KR | 10-2019-0035103 | 4/2019 |
| KR | 10-2019-0134294 | 12/2019 |
| KR | 10-2020-0036127 | 4/2020 |

* cited by examiner

DISPLAY DEVICE INCLUDING FLEXIBLE GROOVED SUBSTRATE

CROSS-REFERENCE TO RELATED APPLICATION(S)

This application claims priority to and benefits of Korean Patent Application No. 10-2020-0113235 under 35 U.S.C. § 119 filed on Sep. 4, 2020 in the Korean Intellectual Property Office, the entire contents of which are incorporated herein by reference.

BACKGROUND

1. Technical Field

The disclosure relates to a display device.

2. Description of the Related Art

As various display devices such as a mobile phone, a tablet PC, a laptop PC, a computer monitor, and a TV are increasingly used, a demand for quality improvement of the display devices is also increasing.

In a case of the display device, there are quality demands for improving display performance such as resolution of the screen and reducing power consumption. In a case of a portable electronic device, it is an important quality improvement target to reduce weight for ease of mobility and to ensure visibility suitable for outdoor use.

In addition, in order to use a larger area of a screen of a display device in displaying images, efforts have been made to reduce a peripheral area. In a case that a display area is formed at a front side of a display device, it is easier to connect a plurality of the display devices to realize a single large screen, the display device may be applied to displays of various types such as a transparent display, a foldable display, and a rollable display, and the display device may be applied to various other fields or applications.

However, in the peripheral area, since there are elements such as a circuit wire, a connection pad, and a driving chip connected to the outside in order to supply an electrical signal and power to the display area, it is difficult to completely eliminate or separate the peripheral area from the display area. As a method for solving this problem, through a bending structure in which an end portion of a display panel in a flexible display is folded, a configuration in which a peripheral area is disposed on a rear surface of the display panel is adopted. As an element to protect the panel during bending, a passivation layer is provided in a bending part. However, since a problem such as peeling of the passivation layer by bending still exists, a solution for the problem is required.

The above information disclosed in this background section is only for enhancement of understanding of the background of the described technology, and therefore it may contain information that does not form the prior art that may already be known to a person of ordinary skill in the art.

SUMMARY

Embodiments provide a display device that may protect a bending area of a display panel by including a passivation layer disposed on the bending area of the display panel, and may prevent peeling of the passivation layer while reducing stress applied to the display panel during bending.

A display device may include a substrate including a first area, a second area, and a bending area disposed between the first area and the second area; a display area overlapping the first area; and a passivation layer overlapping the bending area, wherein the substrate may include a groove formed in the bending area, and an angle between a side wall of the groove of the substrate and an upper surface of the substrate may be about 90 degrees or less.

The passivation layer may be disposed within the groove of the substrate.

The groove of the substrate may be adjacent to the first area of the substrate.

The display area may include a light-emitting element and a polarizer disposed on the light-emitting element, and the groove of the substrate may be adjacent to a region in which the polarizer contacts the passivation layer.

The substrate may include a base layer and at least one organic insulating layer disposed on the base layer; and the groove of the substrate may be formed in the at least one organic insulating layer.

The display device may further include a driver disposed in the second area of the substrate, wherein the substrate may include a signal line disposed between the base layer and the at least one organic insulating layer, the signal line electrically connecting the display area to the driver, and the signal line intersecting the bending area.

The groove of the substrate may include a first width on the upper surface of the substrate; and a second width on a bottom surface of the groove that may be vertically recessed from the upper surface of the substrate, and a length of the second width of the groove of the substrate may be greater than a length of the first width of the groove of the substrate.

The groove of the substrate may have a depth extending in a vertical length from the upper surface of the substrate to the second width of the groove of the substrate, and the depth of the groove of the substrate may be less than the vertical length of the second width of the groove of the substrate.

The side wall of the groove may include protrusions and depressions.

The display device may further include a sub-side recessed from the side wall of the groove and including a step from the side wall in a width direction of the groove of the substrate.

The groove of the substrate may include a first width on the upper surface of the substrate; and a second width on a bottom surface of the groove that may be vertically recessed from the upper surface of the substrate, and a length of the second width of the groove of the substrate may be the same as a length of the first width of the groove of the substrate.

The substrate may include a surface on which the display area may be disposed; and a rear surface disposed at an opposite side of the surface including the display area, the display device may further include a passivation film disposed on the rear surface of the substrate, and the passivation film may include an region coinciding with the first area and the second area and that exposes the rear surface of the substrate coinciding with the bending area.

The second area of the substrate may overlap a portion of the first area of the substrate when the bending area is bent, and a spacer disposed between the second area and the first area in a portion in which the second area overlaps the first area.

A display device may include a substrate including a first area, a second area, and a bending area disposed between the first area and the second area; a display area overlapping the first area; and a passivation layer overlapping the bending area, wherein the substrate may include a groove formed in the bending area, the groove of the substrate may include a first width on an upper surface of the substrate and a second width on a bottom surface of the groove of the substrate that is vertically recessed from the upper surface of the substrate; and a length of the second width of the groove of the substrate may be greater than a length of the first width of the groove of the substrate.

The groove of the groove of the substrate may have a depth extending in a vertical length from the upper surface of the substrate to the second width of the groove of the substrate, and the depth of the groove of the groove of the substrate may be less than the length of the second width of the groove of the substrate.

The length of the first width of the groove of the substrate may be greater than the depth of a vertical direction of the groove of the substrate and less than twice that of the depth of the groove of the substrate.

The passivation layer may contact the bottom surface of the groove and fill the groove of the substrate.

An angle between a side wall and the upper surface of the substrate may be about 90 degrees or less.

The display area may include a light-emitting element and a polarizer disposed on the light-emitting element, and the groove of the substrate may be adjacent to a region in which the polarizer contacts the passivation layer.

The substrate may include a base layer and at least one organic insulating layer disposed on the base layer, and the groove of the substrate may be formed in the at least one organic insulating layer.

According to embodiments, it is possible to prevent peeling by providing excellent adhesion between a bent substrate and a passivation layer, and to reduce cracks that may occur in the bending area by relieving stress applied to the substrate.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
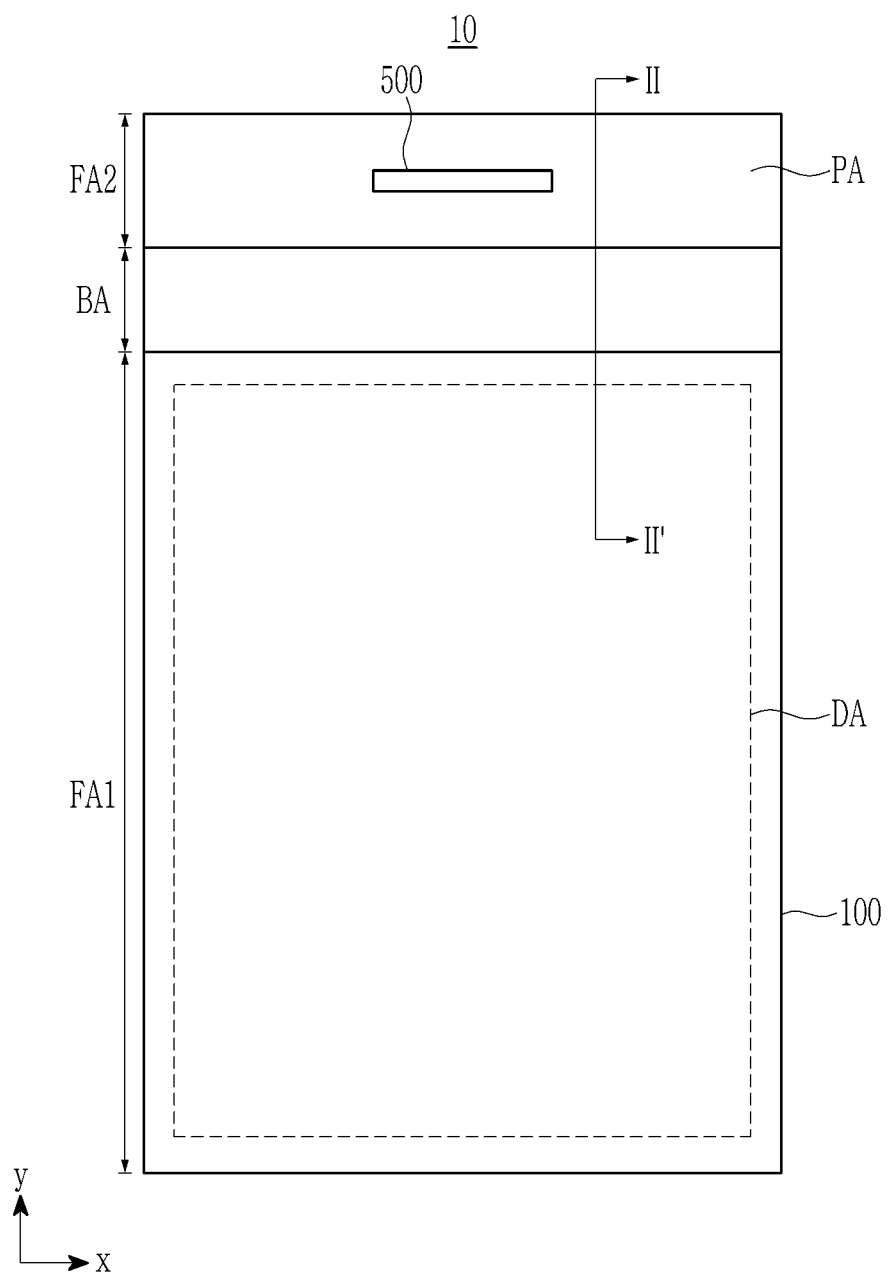
FIG. 1 illustrates a schematic top plan view of a display device according to an embodiment.

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

In order to clearly describe the disclosure, parts that may be irrelevant to the description may be omitted, and identical or similar elements throughout the specification are denoted by the same reference numerals.

Further, in the drawings, the size and thickness of each element are arbitrarily illustrated for ease of description and for clarity, and the disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated and for clarity.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprise" and variations such as "comprises" or "comprising", "include" and variations such as "includes" or "including", and "has" and variations such as "have" or "having" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In the specification and the claims, the phrase "at least one of" is intended to include the meaning of "at least one selected from the group of" for the purpose of its meaning and interpretation. For example, "at least one of A and B" may be understood to mean "A, B, or A and B."

Also, when an element is referred to as being "in contact" or "contacted" or the like to another element, the element may be in "electrical contact" or in "physical contact" with another element; or in "indirect contact" or in "direct contact" with another element. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
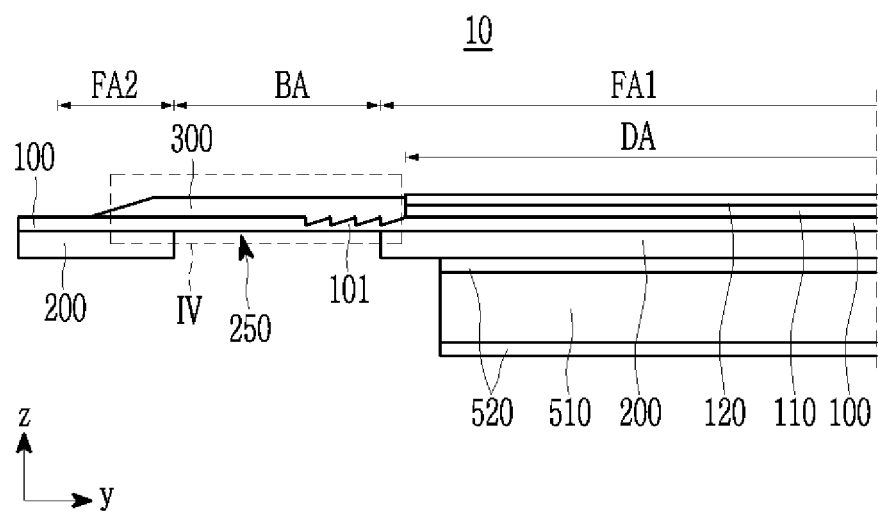
FIG. 2 illustrates a schematic cross-sectional view taken along line II-IF of FIG. 1.
Figure 3:
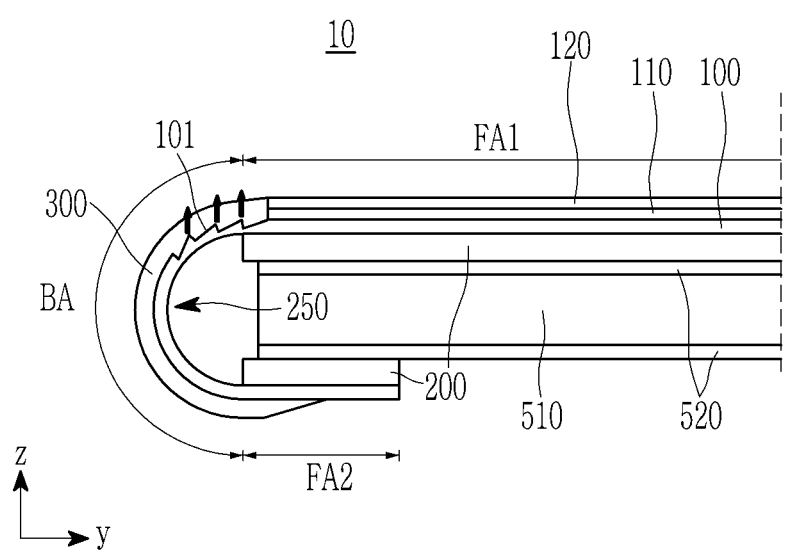
FIG. 3 illustrates a schematic cross-sectional view of the display device of FIG. 2 in a bending state.
Figure 4:
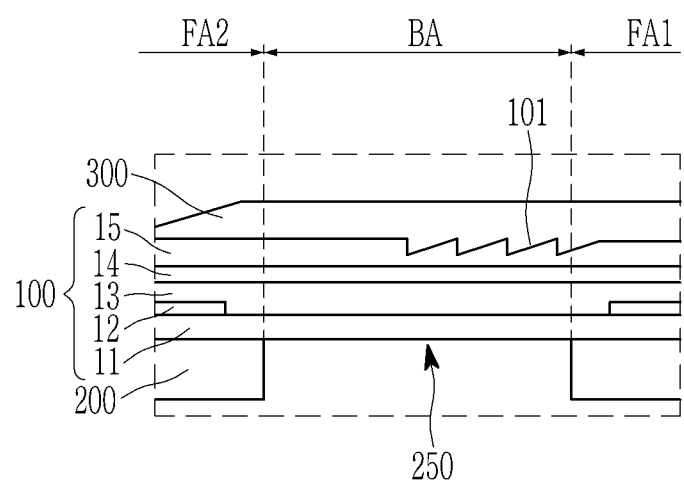
FIG. 4 illustrates an enlarged view of portion IV of FIG. 2.

A display device 10 according to an embodiment will be described with reference to FIG. 1 to FIG. 3. FIG. 1 illustrates a schematic top plan view of a display device according to an embodiment. FIG. 2 illustrates a schematic cross-sectional view taken along line II-IF of FIG. 1. FIG. 3 illustrates a schematic cross-sectional view of the display device of FIG. 2 in a bending state. FIG. 4 illustrates an enlarged view of a portion IV of FIG. 2.

Referring to FIG. 1, the display device 10 according to an embodiment may include a substrate 100. The substrate 100 may include a display part DA for displaying an image or images, and a peripheral part PA disposed around or adjacent to the display part DA. The display part DA may be a display area and the peripheral part PA may be a peripheral area.

The display part DA may include a plurality of pixels, and may include a gate line and a data line electrically connected to the plurality of pixels to transmit a signal or signals. The display part DA of the substrate 100 may display an image or images in a direction of an upper surface T of the substrate 100.

A driver 500 may be disposed on the peripheral part PA of the substrate 100. The driver 500 may be a chip on film (COF) electrically connected to the display part DA, but not limited thereto. For example, the driver 500 may be an integrated circuit chip (IC chip) mounted on (or, directly mounted on) the peripheral part PA. The display device 10 according to an embodiment may further include a printed circuit board (not shown) electrically connected to the driver 500. The driver 500 may receive a driving signal from the printed circuit board, and supply the driving signal to the display part DA.

The substrate 100 may include a first area FA1 and a second area FA2 that may be flat, and a bending area BA disposed between the first area FA1 and the second area FA2. The substrate 100 may be bent in the bending area BA. The display part DA may be disposed in the first area FA1. FIG. 1 illustrates that the display part DA is disposed within the first area FA1, but the disclosure is not limited to the illustrated form. For example, at least a portion of the display part DA may overlap the bending area BA. The second area FA2 may be disposed in the peripheral part PA, and the driver 500 may be disposed in the second area FA2.

The bending area BA may be bent with a respect to an axis parallel to an x-direction. In a case that the substrate 100 is bent, the first area FA1 and the second area FA2 may overlap along a z-direction as shown in FIG. 3.

Referring to FIG. 4, the substrate 100 may include, for example, a base layer 11, and an inorganic insulating layer 12, a first organic insulating layer 13, a wire layer 14, and a second organic insulating layer 15 that may be sequentially formed or disposed on the base layer 11. However, the disclosure is not limited thereto. For example, the substrate 100 may further include a barrier layer, other insulating layer(s), and a wire layer. Each of the layers may have a single-layered configuration or a multi-layered configuration.

The base layer 11 may be a flexible substrate made of a plastic material having good or excellent heat resistance and durability, such as a polyethylene naphthalate (PEN), a polycarbonate (PC), a polyarylate (PAR), a polyether imide (PEI), a polyether sulfone (PES), a polyimide (PI), and a poly(methylmethacrylate) (PMMA). However, the base layer of the disclosure is not limited thereto, and may include various flexible materials.

The inorganic insulating layer 12 may include at least one of a silicon oxide, a silicon nitride, and an aluminum oxide. The inorganic insulating layer 12 is not limited to the above-described materials, and may include any inorganic material. As shown in FIG. 4, the inorganic insulating layer 12 may not be formed or disposed in the bending area BA, and thus damage to the inorganic insulating layer 12 due to bending may be prevented.

The first organic insulating layer 13 and the second organic insulating layer 15 may include one of a polyethersulphone (PES), a polyacrylate (PAR), a polyetherimide (PEI), a polyethylene naphthalate (PEN), a polyethylene terephthalate (PET), a polyphenylene sulfide (PPS), polyarylate, a polyimide (PI), a polycarbonate (PC), a poly(arylene ether sulfone), and a combination thereof. However, the first and second organic insulating layers of the disclosure are not limited thereto, and they may include any organic material. For example, they may include a polyimide (PI).

The wire layer 14 illustrated in FIG. 4 may be a signal line electrically connecting the driver 500 disposed in the second area FA2 and the display part DA disposed in the first area FA1. For example, the wire layer 14 may be electrically connected to a pad through a signal line crossing or intersecting the bending area BA to supply a data signal and gate signal (hereinafter, simply referred to as a 'signal') to a gate line and data line. The wire layer 14 may be made of a single metal layer or a plurality of metal layers. For example, the wire layer 14 may be a metal layer including titanium or aluminum, or a stacked structure of titanium/aluminum/titanium. In FIG. 4, only one or a wire layer 14 is shown corresponding to the bending area BA, but in the first area FA1 and the second area FA2, a plurality of different wires or other wire layers may exist between the insulating layers to supply signal.

Referring back to FIG. 2 and FIG. 3, a light-emitting element or a display element 110 may be disposed corresponding to the display part DA on the substrate 100. The light-emitting element or display element 110 may include an electro optic layer (not shown) for displaying an image and a switching layer (not shown) for turning the electro optic layer on and off. The switching layer may be electrically connected to the driver 500 of the second area FA2 by a signal line. The light-emitting element or display element 110 may be various display elements such as an organic light-emitting display element, a liquid crystal display element, and the like within the spirit and the scope of the disclosure.

A polarization layer 120 may be disposed on the light-emitting element or display element 110 of the display part DA. The polarization layer 120 may reduce the reflection of external light. In a case that the external light passes through the polarization layer 120 and is reflected by the display part DA and then passes through the polarization layer 120 again, a phase of the external light may be changed. A phase of the reflected light and a phase of the external light entering the polarization layer 120 may be different, and extinction interference may occur between the reflected light and the external light.

Although not shown, the display device according to an embodiment may further include a cover window disposed on the polarization layer 120, and an adhesive layer disposed on or between the cover window and the polarization layer 120. The display device may further include a touch detection part and an adhesive layer disposed between the light-emitting element or display element 110 and the polarization layer 120. The touch detection part may detect an external touch, and, using the external touch as an input signal, may acquire coordinate information of an input point. The touch detection part may be provided as a separate unit mounted on the display part DA, or may be formed or disposed (for example, directly formed or disposed) on the display part DA. The adhesive layer disposed between the cover window and the polarization layer 120, and/or the adhesive layer between the polarization layer 120 and the light-emitting element or display element 110 may be a transparent adhesive layer. For example, the adhesive layer may include an optically clear adhesive (OCA), an optically clear resin (OCR), or a pressure sensitive adhesive (PSA).

The substrate 100 may include a groove 101 disposed to correspond to or coinciding with the bending area BA. A plurality of grooves 101 may be provided. The groove 101 may have a shape that may be depressed or recessed from one or a surface of the substrate 100. The thickness of the substrate 100 may be thinner in an area in which the groove 101 is formed than in other areas.

The groove 101 may be formed or disposed in an insulating layer disposed on an uppermost layer of the substrate 100. For example, as shown in FIG. 4, it may be formed or disposed in a depressed or recessed form in the organic insulating layer 15 disposed on the uppermost portion of the substrate 100. A depth of the groove 101 may be set so that the wire layer 14 disposed thereunder is not damaged. The groove 101 may be further deeply formed or disposed in a portion under or below which the wire layer 14 may not be formed or disposed, but is not limited thereto.

A passivation layer 300 may be disposed on the substrate 100 in the bending area BA. Since the substrate 100 includes the groove 101 in the bending area BA, the passivation layer 300 may be disposed to fill the inside of the groove 101. A contact area between the passivation layer 300 and the substrate 100 may be widened by the groove 101, so that a bonding force between them may be improved.

The passivation layer 300 may protect the wire layer 14, the inorganic insulating layer 13, the first and second organic insulating layers 12 and 15, and the base layer 11 that may be disposed in the bending area BA. In case that the passivation layer 300 is included, a central surface in the bending area BA may relatively rise or increase. For example, in a case that the substrate 100 is bent, the central surface of the bending area BA may be positioned near a surface in which the wire layer 14 may be disposed, and compressive or tensile force may be hardly applied to the wire layers 14. The passivation layer 300 may prevent cracking of the signal line or insulating layer in the bending area BA. It may prevent defects due to a disconnection of the signal line in the bending area BA.

The passivation layer 300 may include an organic material such as a polyimide, an epoxy resin, an acrylic resin, a polyester, a photoresist, a polyacrylic resin, a polyimide resin, a polyamide resin, and a siloxane resin, and an elastic material including silicone, urethane, thermoplastic polyurethane, by way of example. However, the disclosure is not limited thereto.

The bending area BA in which the passivation layer 300 may be formed or disposed may be bent with respect to an axis parallel to the x-direction, so that the second area FA2 extending from the bending area BA may be disposed on a rear surface of the first area FA1. In this process, a force is applied to the passivation layer 300 in the bending area BA in a direction of bold arrows of FIG. 3. Accordingly, there is a problem that the passivation layer 300 may be peeled off the substrate 100.

Figure 5:
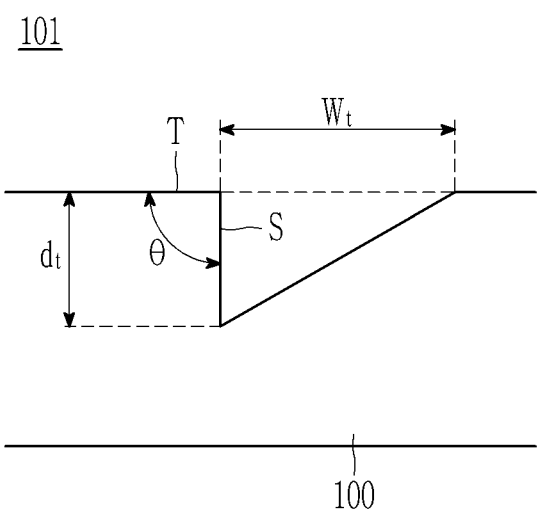
FIG. 5 illustrates a schematic cross-sectional view of a groove of a display device according to an embodiment.

To prevent this, in an embodiment, the groove 101 may be formed or disposed on the substrate 100 contacting the passivation layer 300 so that an angle between a side wall of the groove 101 and an upper surface T of the substrate 100 is about 90 degrees or less. Referring to FIG. 5, a side wall S of the groove 101 forms an angle θ with an upper surface T of the substrate 100. Since the angle θ is about 90 degrees or less, even if a repulsive force is applied in the direction of the bold arrows in FIG. 3, the passivation layer 300 is prevented from being peeled off in the corresponding direction, thus the peeling of the passivation layer 300 may be effectively prevented.

The groove 101 may be disposed closer to the first area FA1 in the bending area BA. The repulsive force due to bending is strongest at a portion in which the passivation layer 300 and the polarization layer 120 contact, and thus, the peeling of the passivation layer 300 frequently occurs in the portion where the passivation layer 300 and the polarization layer 120 contact. Accordingly, by disposing the groove 101 to be adjacent to a region (which is a portion in which the peeling frequently occurs) in which the passivation layer 300 and the polarization layer 120 contact, the peeling of the passivation layer 300 may be more effectively prevented.

In FIG. 5, a width $W_t$ of the groove 101 may be greater than a depth $d_t$ in a vertical direction of the groove 101, and may be smaller than twice the depth $d_t$. By forming the shape of the groove 101 as described above, a resin applied to form the passivation layer 300 may more easily fill the inside of the groove 101, thereby improving coating properties.

As described above, in the display device of an embodiment, by forming the passivation layer 300 corresponding to or coinciding with the bending area BA on the substrate 100, cracks in the bending area BA may be prevented. At the same time, by forming the groove 101 (the angle θ between the side wall of the groove 101 and the upper surface T of the substrate 100 is about 90 degrees or less) depressed or recessed in a direction opposite to the direction of the repulsive force applied to the passivation layer 300, the peeling of the passivation layer 300 due to bending may be effectively prevented.

Referring back to FIG. 2 and FIG. 3, a passivation film 200 may be disposed on the rear surface or a second surface of the substrate 100. For example, the display part DA may be disposed on one or a first surface of the substrate 100, and the passivation film 200 may be disposed on the rear or second surface facing the first surface thereof, which is an opposite side of the one surface of the substrate 100. The passivation film 200 may be attached to one or a surface of the substrate 100 to prevent foreign matters such as air and moisture from penetrating the display element from the outside and to protect the substrate 100 from external impact. The passivation film 200 may include a material such as an acryl-based compound, a polyethylene terephthalate (PET), and a polyimide (PI).

The passivation film 200 may be disposed corresponding to or coinciding with the first area FA1 and the second area FA2, and may not be disposed in the bending area BA. For example, it may include an open part or region 250 corresponding to or coinciding with the bending area BA. By forming the open part or region 250 of the passivation film to not overlap the passivation film 200 in the bending area BA, it is possible to reduce the stress applied to the substrate 100 during bending.

The display device 10 may include a spacer 510 on the rear or second surface of the substrate 100. For example, a spacer 510 may be provided or disposed between the passivation film 200 disposed on the rear or second surface of the first area FA1 and the passivation film 200 disposed on the rear or second surface of the second area FA2. The spacer 510 is disposed between the first area FA1 and the second area FA2 to support the substrate 100 in a state that the substrate 100 is bent. The spacer 510 may be attached to the passivation film 200 by an adhesive layer 520. The spacer 510 may be made of a plastic material such as a polycarbonate (PC), a polyimide (PI), a polyethylene naphthalate (PEN), a polyethylene terephthalate (PET), polymers, and a combination of the above mentioned polymers. Additives for increasing a thickness and strength of the spacer 510 may be further added to the spacer 510. Further, the spacer 510 may be made of glass, ceramic, metal, or other rigid materials, or combinations of the aforementioned materials. Accordingly, the strength of the spacer 510 may be increased, or may have a heat dissipation function.

Hereinafter, a groove of a display device according to an embodiment will be described with reference to FIG. 6 to FIG. 9. FIG. 6 to FIG. 9 respectively illustrate a schematic cross-sectional view of a groove of a display device according to an embodiment.

Figure 6:
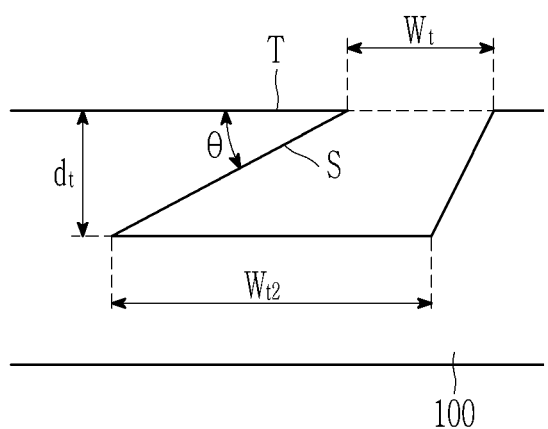
FIG. 6 illustrates a schematic cross-sectional view of a groove of a display device according to an embodiment.

Referring to FIG. 6, a groove 102 of the display device according to an embodiment has a first width $W_t$ on the upper surface T of the substrate 100 and a second width $W_{t2}$ on a bottom surface of the groove 102, and a length of the second width $W_{t2}$ may be longer or greater than a length of the first width $W_t$. According to this, since an area in which the passivation layer 300 and the substrate 100 contact is widened, the bonding force may be increased. Since the repulsive force is applied in a direction from the bottom surface of the groove 102 toward the upper portion of the groove 102, the peeling of the passivation layer 300 in the corresponding direction is prevented by a protrusion of the substrate 100, which is a portion of a side wall S of the groove 102 protruding toward or inward of the groove 102. Therefore, it is possible to more effectively prevent the passivation layer 300 from being peeled off in the z-axis direction. In a case that the passivation layer 300 filling the groove 102 is formed or disposed, the passivation layer 300 in contact with the bottom surface of the groove 102 may be formed or disposed by using a resin having low viscosity of about 500 cps or less.

The depth $d_t$ of the groove 102 may be smaller or less than the length of the second width $W_{t2}$ thereof. Here, the depth $d_t$ of the groove 102 may be defined as a vertical length from the upper surface T of the substrate 100 to a bottom surface of the groove 102 or the second width $W_{t2}$. The first width $W_t$ of the groove 101 may be greater than the depth $d_t$ of a vertical direction of the groove 101, and may be smaller or less than twice that of the depth $d_t$. By securing the length of the first width $W_t$ as described above, a resin applied to form the passivation layer 300 may more easily fill the inside of the groove 102, thereby improving coating properties.

Figure 7:
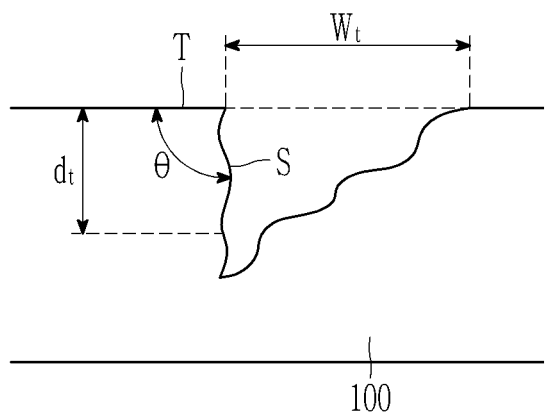
FIG. 7 illustrates a schematic cross-sectional view of a groove of a display device according to an embodiment.

Referring to FIG. 7, a side wall S of a groove 103 of the display device according to an embodiment may have protrusions and depressions. For example, the side wall S of the groove 103 may have an uneven surface having irregular or regular protrusions and depressions. According to this, since a contact area between the substrate 100 and the passivation layer 300 in the groove 103 is further increased, the bonding force between the substrate 100 and the passivation layer 300 may be improved. Therefore, the peeling of the passivation layer 300 may be more effectively prevented. In FIG. 7, the protrusions and depressions may be formed or disposed on the entire side wall S, but the disclosure is not limited thereto. For example, protrusions and depressions may be formed or disposed only on a portion of the side wall S. Further, the shape of protrusions and depressions is not limited to the protrusions and depressions of a substantially round shape as shown in FIG. 7, and any shapes capable of increasing the surface area of the side wall S may be appropriately selected and used.

Figure 8:
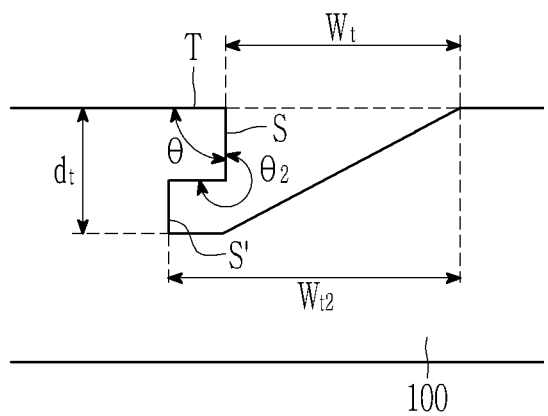
FIG. 8 illustrates a schematic cross-sectional view of a groove of a display device according to an embodiment.

Referring to FIG. 8, a groove 104 of the display device according to an embodiment may include a sub-side wall S' further depressed or recessed from the side wall S with a step from the side wall S in a width direction (x-direction) of the groove 104. As an example, the sub-side wall S' may form an angle θ2 with respect to the sidewall S. Since a shape of the groove 104 is further depressed or recessed to a position at which the sub-side wall S' is positioned, the peeling of the passivation layer 300 filling the corresponding portion may be more effectively prevented. For example, in FIG. 8, since the substrate 100 is further protruded on an upper portion of the passivation layer 300 at a portion, in contact with the sub-side wall S' even in a case that a repulsive force in the z-direction is applied, peeling of the passivation layer 300 may be prevented. Accordingly, the z-direction peeling of the passivation layer 300 may be prevented.

Figure 9:
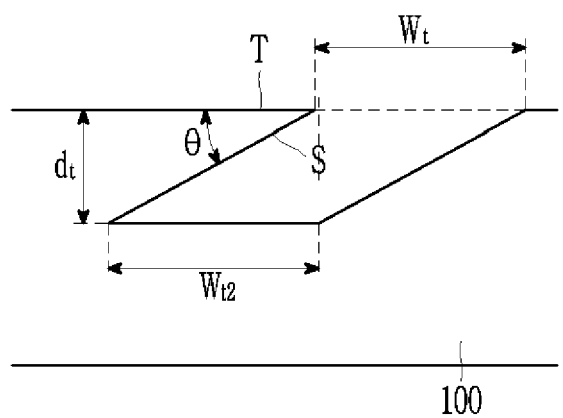
FIG. 9 illustrates a schematic cross-sectional view of a groove of a display device according to an embodiment.

The groove 105 may be vertically depressed or recessed from the upper surface T of the substrate 100. Referring to FIG. 9, a groove 105 of the display device according to an embodiment has a first width $W_t$ on an upper surface T of the substrate 100 and a second width $W_{t2}$ on a bottom surface of the groove 105a The second width $W_{t2}$ and the first width $W_t$ may be the same. An angle θ between the side wall S of the groove 105 and the upper surface T of the substrate 100 may be about 90 degrees or less. According to this configuration, by making the second width $W_{r2}$ of the bottom surface long enough, a contact area between the passivation layer 300 and the substrate 100 may be increased, and thus, the bonding force between the passivation layer 300 and the substrate 100 may be improved. Since the angle θ between the side wall S and the upper surface T of the substrate 100 is about 90 degrees or less, even if a repulsive force is applied in the z-direction, the passivation layer 300 is prevented from being peeled in the corresponding direction, thereby effectively preventing the peeling of the passivation layer 300.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure and the appended claims.

What is claimed is:

1. A display device comprising:
    a substrate, the substrate including a first area, a second area, and a bending area disposed between the first area and the second area;
    a display area overlapping the first area; and
    a passivation layer overlapping the bending area, wherein the substrate includes a groove formed in the bending area,
    an angle between a side wall of the groove of the substrate and an upper surface of the substrate is about 90 degrees or less,
    the passivation layer is disposed within the groove of the substrate, and
    the groove of the substrate either abuts or is at least partially disposed in the first area of the substrate.

2. The display device of claim 1, wherein
    the display area includes a light-emitting element and a polarizer disposed on the light-emitting element, and
    the groove of the substrate abuts a location in which the polarizer contacts the passivation layer.

3. The display device of claim 1, wherein
    the substrate includes a base layer and at least one organic insulating layer disposed on the base layer, and
    the groove of the substrate is formed in the at least one organic insulating layer.

4. The display device of claim 3, further comprising
    a driver disposed in the second area of the substrate,
    wherein the substrate includes a signal line disposed between the base layer and the at least one organic insulating layer, the signal line electrically connecting the display area to the driver, and the signal line intersecting the bending area.

5. The display device of claim 1, wherein
    the groove of the substrate includes:
        a first width on the upper surface of the substrate; and
        a second width on a bottom surface of the groove that is vertically recessed from the upper surface of the substrate, and
    a length of the second width of the groove of the substrate is greater than a length of the first width of the groove of the substrate.

6. The display device of claim 5, wherein
    the groove of the substrate has a depth extending in a vertical length from the upper surface of the substrate to the second width of the groove of the substrate, and
    the depth of the groove of the substrate is less than the vertical length of the second width of the groove of the substrate.

7. The display device of claim 1, wherein the side wall of the groove includes protrusions and depressions.

8. The display device of claim 1, further comprising:
    a sub-side wall recessed from the side wall of the groove and including a step from the side wall in a width direction of the groove of the substrate.

9. The display device of claim 1, wherein
    the groove includes:
        a first width on the upper surface of the substrate; and
        a second width on a bottom surface of the groove that is vertically recessed from the upper surface of the substrate, and
    a length of the second width of the groove of the substrate is the same as a length of the first width of the groove of the substrate.

10. The display device of claim 1, wherein
    the substrate includes:
        a surface on which the display area is disposed; and
        a rear surface disposed at an opposite side of the surface including the display area,
    the display device further includes a passivation film disposed on the rear surface of the substrate, and
    the passivation film includes an open region coinciding with the first area and the second area and that exposes the rear surface of the substrate coinciding with the bending area.

11. The display device of claim 1, wherein
    the second area of the substrate overlaps a portion of the first area of the substrate when the bending area is bent, and
    a spacer disposed between the second area and the first area in a portion in which the second area overlaps the first area.

12. The display device of claim 1, wherein the groove is disposed in a surface of the substrate that faces away from a center of curvature of the bending area.

13. The display device of claim 1, wherein an area of a first side wall of the groove that intersects the upper surface of the substrate is less than an area of a second side wall of the groove that intersects the upper surface of the substrate.

14. The display device of claim 1, wherein the groove only partially penetrates through the substrate.

15. A display device comprising:
    a substrate including a first area, a second area, and a bending area disposed between the first area and the second area;
    a display area overlapping the first area; and
    a passivation layer overlapping the bending area, wherein
    the substrate includes a groove formed in the bending area,
    the passivation layer is disposed within the groove of the substrate,
    the groove of the substrate includes:
        a first width on an upper surface of the substrate; and
        a second width on a bottom surface of the groove of the substrate that is vertically recessed from the upper surface of the substrate,
    a length of the second width of the groove of the substrate is greater than a length of the first width of the groove of the substrate, and
    the groove of the substrate either abuts or is at least partially disposed in the first area of the substrate.

16. The display device of claim 15, wherein
    the groove of the substrate has a depth extending in a vertical length from the upper surface of the substrate to the second width of the groove of the substrate, and the depth of the groove of the substrate is less than the length of the second width of the groove of the substrate.

17. The display device of claim 16, wherein the length of the first width of the groove of the substrate is greater than the depth of a vertical direction of the groove of the substrate and less than twice that of the depth of the groove of the substrate.

18. The display device of claim 15, where the passivation layer contacts the bottom surface of the groove and fills the groove of the substrate.

19. The display device of claim 15, wherein an angle between a side wall and the upper surface of the substrate is about 90 degrees or less.

20. The display device of claim 15, wherein
the display area includes a light-emitting element and a polarizer disposed on the light-emitting element, and
the groove of the substrate is adjacent to a region in which the polarizer contacts the passivation layer.

21. The display device of claim 15, wherein
the substrate includes a base layer and at least one organic insulating layer disposed on the base layer, and
the groove of the substrate is formed in the at least one organic insulating layer.

* * * * *